United States Patent
Hu

(10) Patent No.: US 10,068,889 B2
(45) Date of Patent: Sep. 4, 2018

(54) SYSTEM IN PACKAGE

(71) Applicant: Dyi-Chung Hu, Hsinchu (TW)

(72) Inventor: Dyi-Chung Hu, Hsinchu (TW)

(*) Notice: Subject to any disclaimer, the term of this patent is extended or adjusted under 35 U.S.C. 154(b) by 0 days.

(21) Appl. No.: 15/450,108

(22) Filed: Mar. 6, 2017

(65) Prior Publication Data

US 2017/0179102 A1 Jun. 22, 2017

Related U.S. Application Data

(62) Division of application No. 14/931,044, filed on Nov. 3, 2015, now Pat. No. 9,673,148.

(51) Int. Cl.
*H01L 21/00* (2006.01)
*H01L 25/00* (2006.01)
(Continued)

(52) U.S. Cl.
CPC .......... *H01L 25/50* (2013.01); *H01L 21/565* (2013.01); *H01L 21/768* (2013.01); *H01L 23/3114* (2013.01); *H01L 23/49805* (2013.01); *H01L 23/49866* (2013.01); *H01L 23/5226* (2013.01); *H01L 23/5386* (2013.01); *H01L 23/5389* (2013.01); *H01L 23/53242* (2013.01); *H01L 24/02* (2013.01); *H01L 24/19* (2013.01); *H01L 24/20* (2013.01); *H01L 24/96* (2013.01); *H01L 25/0652* (2013.01); *H01L 25/0655* (2013.01); *H01L 25/16* (2013.01); *H01L 21/568* (2013.01); *H01L 2224/02311* (2013.01); *H01L 2224/02331* (2013.01); *H01L 2224/02373* (2013.01); *H01L 2224/02381* (2013.01); *H01L 2224/04105* (2013.01); *H01L 2224/12105* (2013.01); *H01L 2924/18162* (2013.01);
(Continued)

(58) Field of Classification Search
CPC ..... H01L 25/50; H01L 21/565; H01L 21/768; H01L 21/568; H01L 24/02; H01L 24/09; H01L 24/19; H01L 24/20; H01L 25/0652; H01L 25/0655; H01L 2224/02311; H01L 2224/02331; H01L 2224/02373; H01L 2224/02381; H01L 2224/0415; H01L 2224/12105; H01L 2924/18162; H01L 2924/19041; H01L 2924/19042; H01L 2924/19043
See application file for complete search history.

(56) References Cited

U.S. PATENT DOCUMENTS

2006/0042834 A1* 3/2006 Lee .................. H01L 24/72
                                                    174/267
2009/0087951 A1* 4/2009 Jeon .................. H01L 21/6835
                                                    438/118
(Continued)

*Primary Examiner* — Vongsavanh Sengdara
(74) *Attorney, Agent, or Firm* — JCIPRNET

(57) ABSTRACT

An electronic system without using solder balls between electrical components, and without using interposer between chips and package substrate, without using a discrete system board for the chip package to mount. A chip is wrapped by molding material, a first redistribution circuitry is built on a bottom side of the molding material; a second redistribution circuitry is built on a bottom side of the first redistribution circuitry. A third redistribution circuitry is built on a bottom side of the second redistribution circuitry. Plated metal vias are configured between each two of the electrical components.

12 Claims, 5 Drawing Sheets

(51) Int. Cl.
    *H01L 21/56*     (2006.01)
    *H01L 21/768*    (2006.01)
    *H01L 23/31*     (2006.01)
    *H01L 23/522*    (2006.01)
    *H01L 23/532*    (2006.01)
    *H01L 23/538*    (2006.01)
    *H01L 25/16*     (2006.01)
    *H01L 23/498*    (2006.01)
    *H01L 23/00*     (2006.01)
    *H01L 25/065*    (2006.01)

(52) U.S. Cl.
    CPC .............. *H01L 2924/19041* (2013.01); *H01L 2924/19042* (2013.01); *H01L 2924/19043* (2013.01)

(56) References Cited

U.S. PATENT DOCUMENTS

| | | | | |
|---|---|---|---|---|
| 2009/0288055 | A1* | 11/2009 | Shankar | G06F 17/5045 716/126 |
| 2013/0037943 | A1* | 2/2013 | Yamano | H01L 25/0657 257/737 |
| 2013/0037950 | A1* | 2/2013 | Yu | H01L 23/49816 257/738 |
| 2014/0091471 | A1 | 4/2014 | Chen et al. | |
| 2015/0221577 | A1* | 8/2015 | Liou | H01L 23/147 257/692 |

* cited by examiner

SYSTEM IN PACKAGE

RELATED APPLICATION(S)

This application is a divisional application of application Ser. No. 14/931,044, filed Nov. 3, 2015, the entire disclosure of which is incorporated by reference herein.

BACKGROUND

Technical Field

The present invention relates to an electrical package system; especially relates to a system in package (SiP) without using the following components: discrete solder balls, discrete interposer, discrete package substrate, underfill, and discrete system board.

Description of Related Art

FIG. 1 shows a prior art.

FIG. 1 shows chips 101, 102 configured on a top side of a traditional system in package. Three pluralities of solder balls 141, 142, 143 have been used to join each two components of the system. A first plurality of solder balls 141 join the chips 101, 102 to the silicon interposer 11. A second plurality of solder balls 142 join the silicon interposer 11 to the package substrate 12. A third plurality of solder balls 143 join the package substrate 12 to the system board 13.

Each of the chips 101, 102 has a plurality of I/O pads 103 configured on a bottom side of the chip. The silicon interposer 11 has a core silicon substrate 110. A plurality of conductive through silicon vias (TSVs) 171 passes through the core silicon substrate 110 as an electrical connection between a top redistribution layer (RDL) 111 and a bottom redistribution layer (RDL) 112. The top RDL 111 is configured on a top surface of the silicon substrate 110, and a bottom RDL 112 is configured on a bottom surface of the silicon substrate 110. The plurality of first solder balls 141 are configured between the plurality of I/O pads and the top RDL 111 as an electrical connector there between.

A package substrate 12 is configured on a bottom side of the silicon interposer 11. The package substrate 12 has a core substrate 120 made of laminates and prepregs, a plurality of conductive through laminate vias (TLVs) 172 pass through the core substrate 120. A top RDL 121 is configured on a top side of the core substrate 120, and a bottom RDL 122 is configured on a bottom side of the core substrate 120. A plurality of second solder balls 142 are configured between the silicon interposer 11 and the package substrate 12 as an electrical connector there between. The TLVs 172 electrically couples the top RDL 121 and the bottom RDL 122.

A system board 13 is configured on a bottom of the package substrate 12. The system board 13 has a core substrate 130 made of laminates and prepregs, a plurality of conductive through laminate vias (TLVs) 173 passes through the core substrate 130. A top RDL 131 is configured on a top side of the core substrate 130 and a bottom RDL 132 is configured on a bottom side of the core substrate 130. A plurality of third solder balls 154 are configured between the package substrate 12 and the system board 13 as an electrical connector there between. The TLVs 173 electrically couples the top RDL 131 and the bottom RDL 132.

A first underfill 151 is filled into a space between chips 101, 102 and the silicon interposer 11. A second underfill 152 is filled into a space between silicon interposer 11 and the package substrate 12. A third underfill 153 is filled into a space between the package substrate 12 and the system board 13.

The prior art uses three plurality of solder balls 141, 142, 143 as the electrical connectors to join neighbored two electrical components of the system. The prior art further uses a silicon interposer 11 as an electrical connector between the chips 101, 102 and the package substrate 13. The prior art further uses a discrete system board 13. The prior art further more uses three underfill 151, 152, 153 for advancing the reliability between the interface of the neighbored two discrete electrical components. It is a bulky electronic system. In response to a demand for smaller, lighter and thinner consumer products, a new electronic system meeting the demand has been eager to develop.

DETAILED DESCRIPTION OF THE INVENTION

Figure 1:
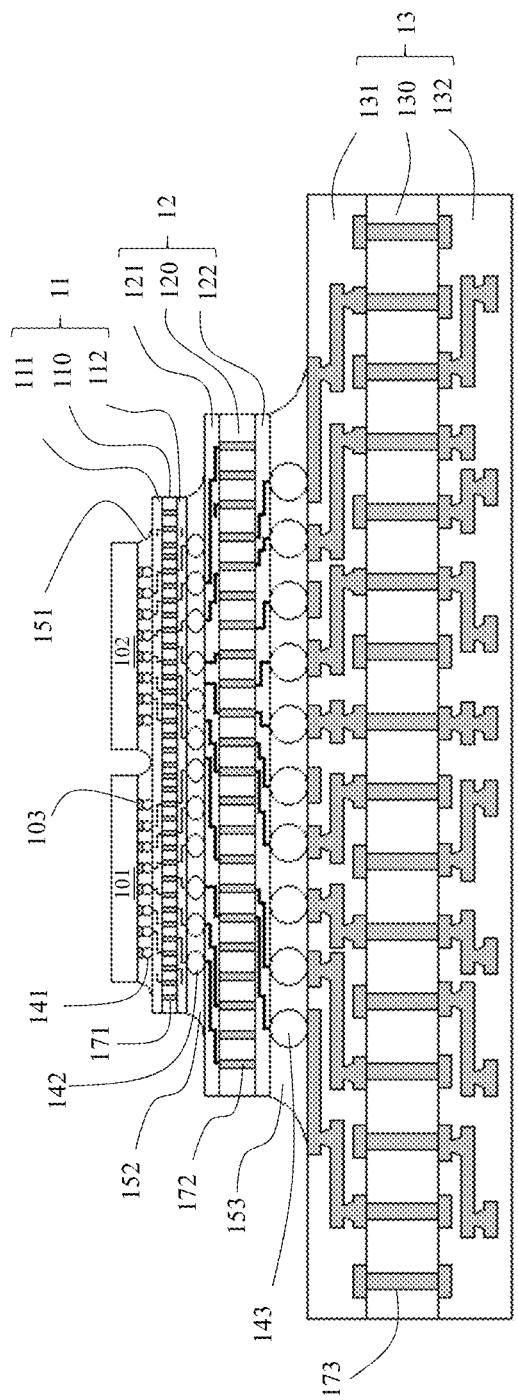
FIG. 1 shows a prior art.

A simplified structure and more reliable system in package (SiP) is developed according to the present invention. The disclosed system does without using solder balls, interposer, package, system board, and underfill. A first RDL 21 is built according to IC design to integrate the plurality of first solder balls 141 and the silicon interposer 11 of the prior art. A second RDL 22 is built according to PCB design rule to integrate the plurality of second solder balls 142, the package substrate 12, the plurality of third solder balls 143, and the system board 13 of the prior art. The present invention made the SiP an extremely thin package.

Figure 2:
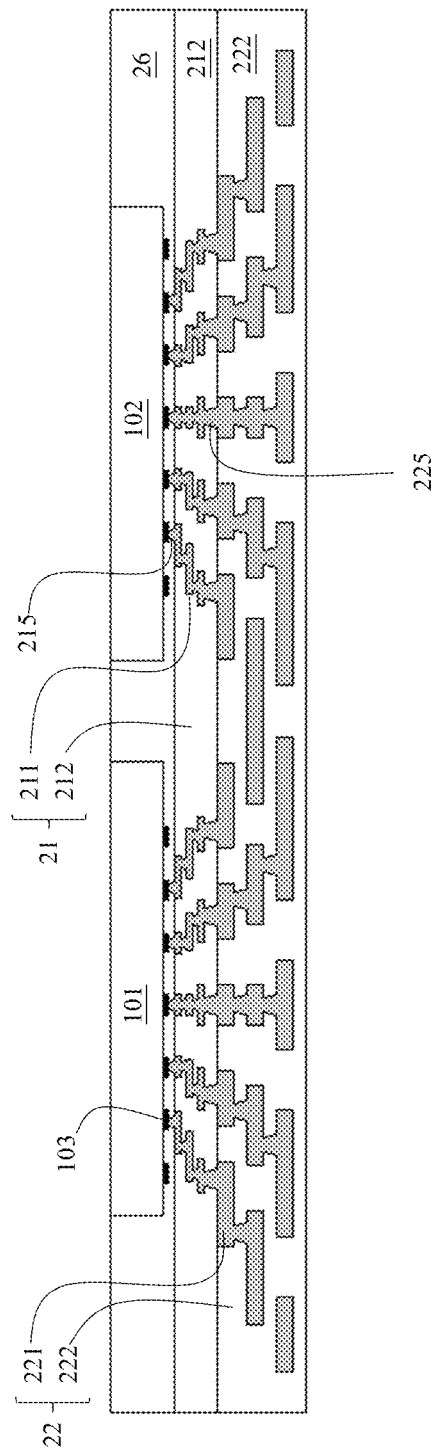
FIG. 2 shows a first embodiment according to the present invention.

FIG. 2 shows a first embodiment according to the present invention.

FIG. 2 shows a system in package (SiP) which comprises chips 101, 102 configured on a top side of the package. Each of the chips 101, 102 has a plurality of I/O pads 103 configured on a bottom side of each chip; molding material 26 wraps the chips 101, 102 at least four lateral sides and a bottom side of the chips.

A first RDL 21 has a first redistribution circuitry 211 embedded in a first dielectric layer 212. The first redistribution circuitry 211, fabricated according to IC design rule, is configured on a bottom side of the molding material 26. A top end of the first redistribution circuitry 211 is electrically coupled to the I/O pads 103 of the chips through a plurality of first metal vias 215.

A second RDL 22 has a second redistribution circuitry 221 embedded in a second dielectric layer 222. The second redistribution circuitry 221, fabricated according to PCB design rule, is configured on a bottom side of the first redistribution circuitry 211. A top end of the second redistribution circuitry 221 is electrically coupled to the first redistribution circuitry 211 through a plurality of second metal vias 225.

Figure 3:
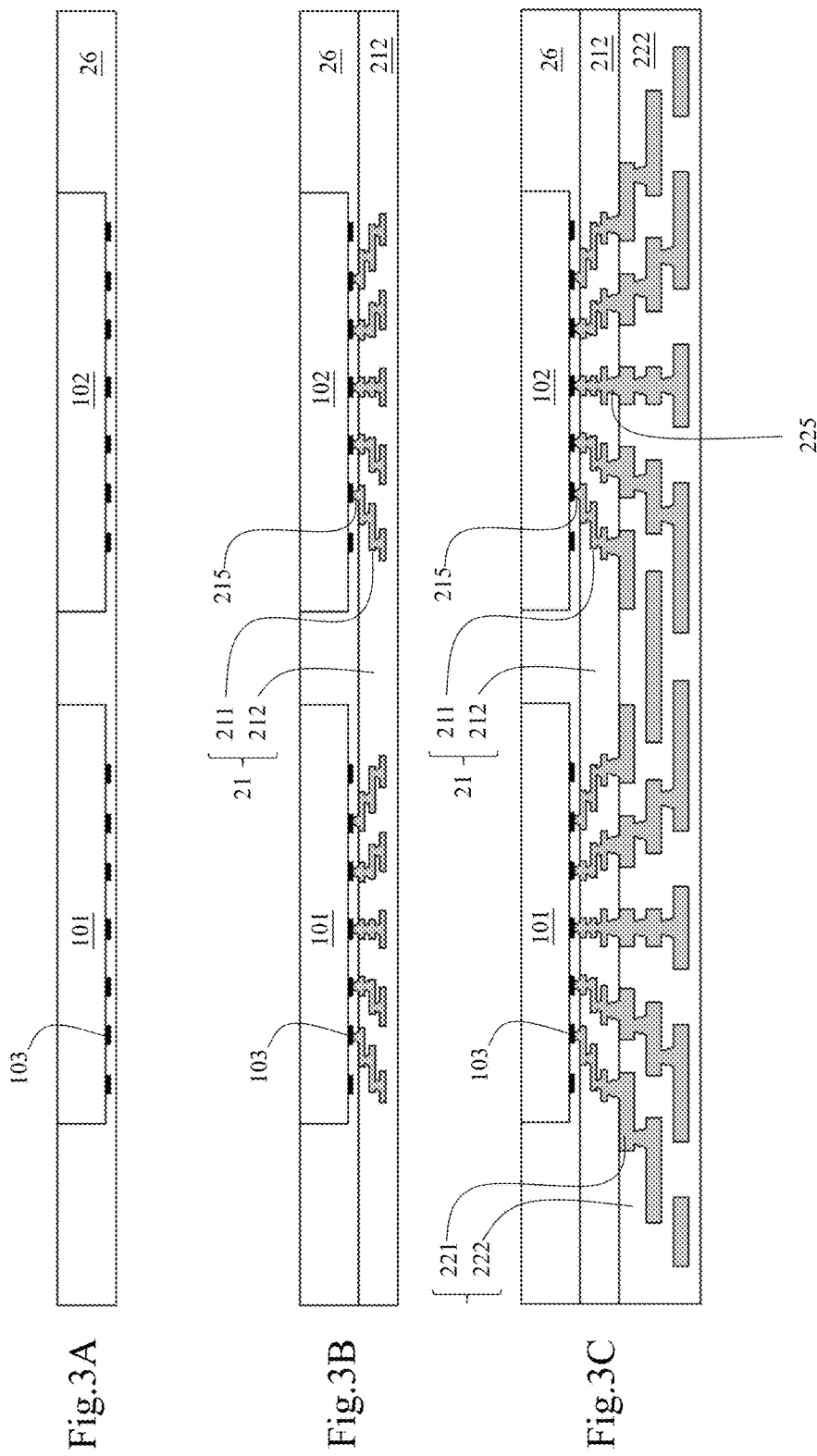
FIGS. 3A~3C show a fabricating process for the first embodiment according the present invention.

FIGS. 3A~3C show a fabricating process for the first embodiment according the present invention.

FIG. 3A shows: wrapping a plurality of chips 101, 102 with molding material 26; wherein a temporary carrier (not shown) configured on a top side of the chips 101, 102 is omitted to describe for simplification of the specification.

FIG. 3B shows: forming a first RDL 21 on a bottom surface of the molding material 26; the first RDL 21 has a first redistribution circuitry 211 embedded in a first dielectric layer 212.

FIG. 3C shows: forming a second RDL 22 on a bottom side of the first RDL 21. The second RDL 22 has a second redistribution circuitry 221 embedded in a second dielectric layer 222.

Figure 4:
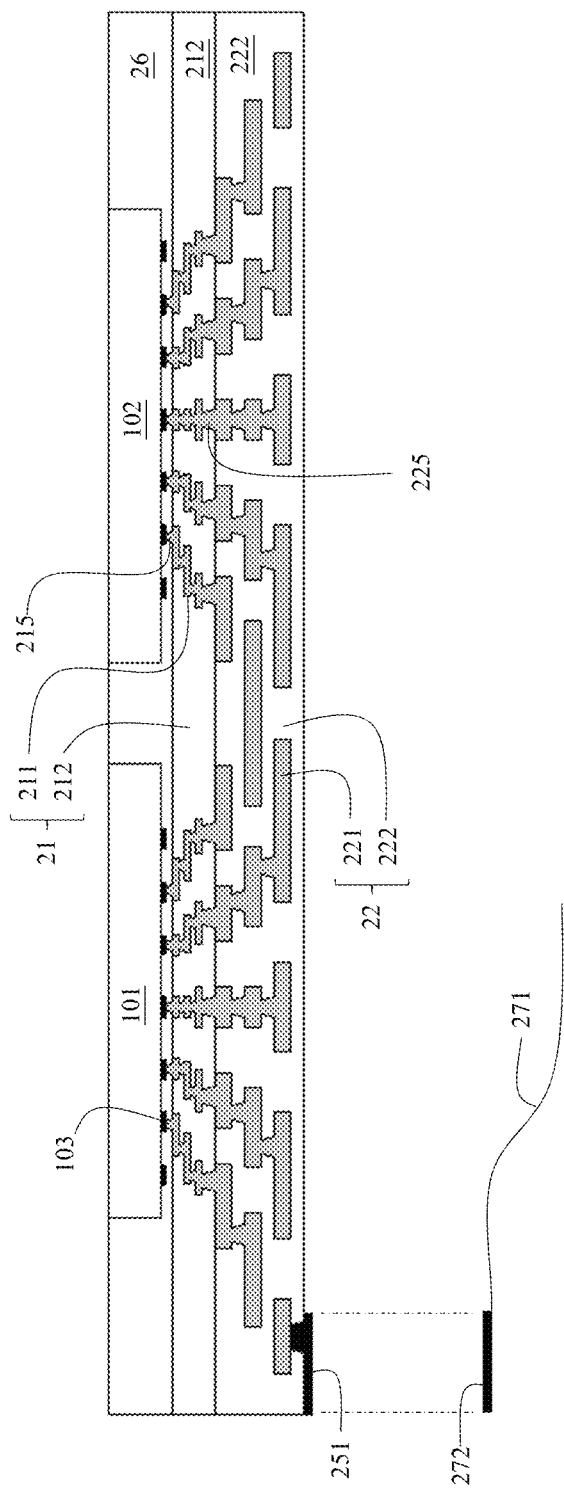
FIG. 4 shows a second embodiment according to the present invention.

FIG. 4 shows a second embodiment according to the present invention.

FIG. 4 shows a plurality of first gold fingers 251 formed on a bottom side of the second dielectric layer 222. The plurality of the first gold fingers 251 are electrically coupled to the second redistribution circuitry 221. The plurality of the first gold fingers 251 function as I/O contacts for the package system.

A flexible circuit board 271 can be prepared separately. A plurality of gold fingers 272 corresponding to the plurality of gold fingers 251 are formed on a left end of the flexible circuit board 271. A right end of the flexible circuit board 271 is electrically coupled to a power supply, additional electrical components, or a control system.

Figure 5:
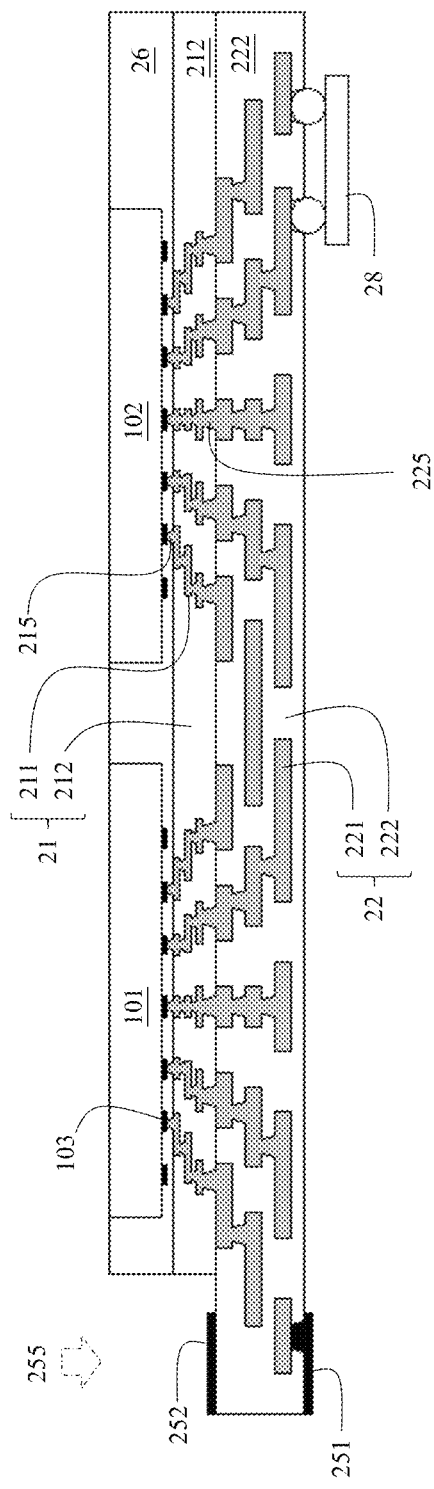
FIG. 5 shows a third embodiment according to the present invention.

FIG. 5 shows a third embodiment according to the present invention.

FIG. 5 shows the second RDL 22 is made wider than the first RDL 21 in the left side. FIG. 5 shows an extended area 255 is formed on a left side of the third RDL 22. A plurality of first gold fingers 251 are formed on a bottom side of the extended area 255. A plurality of second gold fingers 252 are formed on a top side of the extended area 255. The gold fingers 251, 252 are electrically coupled into a gold finger socket (not shown) or other connector (not shown) so that the package can be electrically coupled with additional electronic components. FIG. 5 further shows, at least one passive component 28 such as resistor, capacitor, inductor or other electronic components (not shown) can be optionally configured on a bottom side of the third RDL 23 and electrically coupled to the third redistribution circuitry 231.

While several embodiments have been described by way of example, it will be apparent to those skilled in the art that various modifications may be configured without departs from the spirit of the present invention. Such modifications are all within the scope of the present invention, as defined by the appended claims.

What is claimed is:

1. A fabricating process for a System in Package, the method comprising:
    wrapping at least one chip with a molding material;
    forming a first redistribution circuitry on a bottom of the molding material, the first redistribution circuitry embedded in a first dielectric layer, and electrically coupled with a plurality of input/output pads of the chip through a plurality of first metal vias;
    forming a second redistribution circuitry on a bottom of the first redistribution circuitry, the second redistribution circuitry embedded in a second dielectric layer, and electrically coupled to the first redistribution circuitry through a plurality of second metal vias, wherein the second dielectric layer has an extended area extending beyond a side edge of the first dielectric layer and a side edge of the molding material; and
    forming a plurality of top gold fingers on a top of the extended area of the second dielectric layer.

2. The fabricating process as claimed in claim 1, further comprising:
    forming a plurality of first gold fingers on a bottom surface of the second dielectric layer.

3. The fabricating process as claimed in claim 2, further comprising:
    forming a flexible circuit board with a plurality of third gold fingers corresponding the plurality of first gold fingers, and adapted to be electrically coupled to the plurality of the first gold fingers.

4. The fabricating process as claimed in claim 1, further comprising:
    forming a plurality of openings on a bottom of the second dielectric layer to expose a plurality of metal pads of a lowermost circuit layer of the second redistribution circuitry; and
    electrically coupling at least one passive element with the exposed metal pads.

5. A fabricating process for a System in Package, the method comprising:
    wrapping at least one chip with a molding material;
    forming a first redistribution circuitry on a bottom of the molding material, the first redistribution circuitry embedded in a first dielectric layer, and electrically coupled with a plurality of input/output pads of the chip through a plurality of first metal vias;
    forming a second redistribution circuitry on a bottom of the first redistribution circuitry, the second redistribution circuitry embedded in a second dielectric layer, and electrically coupled to the first redistribution circuitry through a plurality of second metal vias, wherein the second dielectric layer has an extended area extending beyond a side edge of the first dielectric layer and a side edge of the molding material; and
    forming a plurality of top gold fingers on a top of the extended area of the second dielectric layer,
    wherein the molding material has a topmost surface coplanar with a topmost surface of the chip.

6. The fabricating process as claimed in claim 5, further comprising:
    forming a plurality of first gold fingers on a bottom surface of the second dielectric layer.

7. The fabricating process as claimed in claim 6, further comprising:
    forming a flexible circuit board with a plurality of third gold fingers corresponding the plurality of first gold fingers, and adapted to be electrically coupled to the plurality of the first gold fingers.

8. The fabricating process as claimed in claim 5, further comprising:
    forming a plurality of openings on a bottom of the second dielectric layer to expose a plurality of metal pads of a lowermost circuit layer of the second redistribution circuitry; and
    electrically coupling at least one passive element with the exposed metal pads.

9. A fabricating process for a System in Package (SiP), the method comprising:
    wrapping at least one chip with a molding material;
    forming a first redistribution circuitry on a bottom of the molding material, the first redistribution circuitry embedded in a first dielectric layer, and electrically coupled with a plurality of input/output pads of the chip through a plurality of first metal vias;
    forming a second redistribution circuitry on a bottom of the first redistribution circuitry, the second redistribution circuitry embedded in a second dielectric layer, and electrically coupled to the first redistribution circuitry through a plurality of second metal vias, wherein the second dielectric layer has an extended area extending beyond a side edge of the first dielectric layer and a side edge of the molding material; and forming a plurality of top gold fingers on a top of the extended area of the second dielectric layer, wherein the SiP comprises:

the at least one chip having the plurality of input/output pads;

the molding material wrapping the chip;

the first redistribution circuitry configured on the bottom of the molding material, the first redistribution circuitry electrically coupled to the plurality of input/output pads of the chip through the plurality of first metal vias; and the second redistribution circuitry configured on the bottom of the first redistribution circuitry, the second redistribution circuitry electrically coupled to the first redistribution circuitry through the plurality of second metal vias, wherein the second dielectric layer has the extended area extending beyond the side edge of the first dielectric layer, and wherein the SiP is free of solder balls, an interposer, a package substrate, a system board, and underfill.

10. The fabricating process as claimed in claim 9, further comprising:

forming a plurality of first gold fingers on a bottom surface of the second dielectric layer.

11. The fabricating process as claimed in claim 10, further comprising:

forming a flexible circuit board with a plurality of third gold fingers corresponding the plurality of first gold fingers, and adapted to be electrically coupled to the plurality of the first gold fingers.

12. The fabricating process as claimed in claim 9, further comprising:

forming a plurality of openings on a bottom of the second dielectric layer to expose a plurality of metal pads of a lowermost circuit layer of the second redistribution circuitry; and electrically coupling at least one passive element with the exposed metal pads.

* * * * *